(12) United States Patent
Takekuma et al.

(10) Patent No.: US 6,848,625 B2
(45) Date of Patent: Feb. 1, 2005

(54) PROCESS LIQUID SUPPLY MECHANISM AND PROCESS LIQUID SUPPLY METHOD

(75) Inventors: Takashi Takekuma, Kikuchi-gun (JP);
Toshinobu Furusho, Kikuchi-gun (JP);
Takeshi Ohto, Kikuchi-gun (JP);
Hiroyuki Miyamoto, Kikuchi-gun (JP);
Kousuke Yoshihara, Kikuchi-gun (JP);
Shinya Hori, Kikuchi-gun (JP);
Hiroyuki Hara, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/388,357

(22) Filed: Mar. 14, 2003

(65) Prior Publication Data
US 2003/0180471 A1 Sep. 25, 2003

(30) Foreign Application Priority Data
Mar. 19, 2002 (JP) .......................... 2002-076419

(51) Int. Cl.$^7$ ................................. B05B 17/00
(52) U.S. Cl. ................. 239/1; 239/69; 239/71
(58) Field of Search ................... 239/1, 69, 71

(56) References Cited
U.S. PATENT DOCUMENTS

| | | | |
|---|---|---|---|
| 5,035,200 A | | 7/1991 | Moriyama et al. |
| 5,680,329 A | * | 10/1997 | Lloyd et al. ............... 700/275 |
| 5,938,847 A | | 8/1999 | Akimoto et al. |
| 6,056,998 A | | 5/2000 | Fujimoto |
| 6,089,469 A | * | 7/2000 | Fusama et al. ............ 239/71 |
| 6,238,109 B1 | * | 5/2001 | Minami .................... 396/604 |
| 6,391,111 B1 | * | 5/2002 | Fujimoto et al. .......... 118/321 |
| 6,725,940 B1 | * | 4/2004 | Klein et al. ................ 169/15 |

* cited by examiner

Primary Examiner—Hoang Nguyen
(74) Attorney, Agent, or Firm—Oblon, Spivak, McClelland, Maier & Neustadt, P.C.

(57) ABSTRACT

A process liquid supply mechanism for supplying a process liquid comprises a process liquid supply source for supplying a process liquid, a process liquid discharging nozzle for discharging the process liquid, a pipe connecting the process liquid supply source to the process liquid discharging nozzle, a pump mounted to the pipe for allowing the process liquid to be discharged from the process liquid discharging nozzle, a pressure sensor for detecting the pressure of the process liquid at a prescribed position intermediate between the pump and the process liquid discharging nozzle, and a controller for controlling the inner pressure of the pump based on the pressure value detected by the pressure sensor and the relationship obtained in advance between the pressure and the discharging rate of the process liquid such that the process liquid is discharged at a prescribed discharging rate.

30 Claims, 11 Drawing Sheets

PROCESS LIQUID SUPPLY MECHANISM AND PROCESS LIQUID SUPPLY METHOD

BACKGROUND OF THE INVENTION

1. Field of the Invention

The present invention relates to a process liquid supply mechanism and a process liquid supply method for supplying a process liquid such as a resist solution in the manufacturing process of, for example, a semiconductor device.

2. Description of the Related Art

In the manufacturing process of a semiconductor device, a resist pattern that is used as a mask for forming a prescribed pattern is formed by means of a so-called "photolithography technology", in which a resist solution is supplied onto a semiconductor wafer so as to form a resist film, followed by applying a light exposure treatment in a prescribed pattern to the wafer after the resist coating step and subsequently developing the light-exposed pattern formed on the resist film on the wafer. In the resist coating process among the manufacturing steps noted above, a spin coating method is employed in many cases as a method for uniformly coating the wafer surface with the resist solution.

In the spin coating method, a resist solution is discharged from a resist nozzle arranged above the wafer onto the central portion of the wafer surface while rotating the wafer together with a spin chuck by a rotary driving mechanism, with the wafer held stationary on the spin chuck by means of vacuum suction. The discharged resist solution is centrifugally expanded radially outward on the wafer surface so as to form a resist film on the entire surface of the wafer. Then, the discharging of the resist solution is stopped, and the rotation of the wafer is continued so as centrifugally remove the extra resist solution on the wafer surface, thereby controlling the thickness of the resist film and drying the resist film.

In order to form a resist pattern with a high precision, it is necessary to form the resist film in a prescribed uniform thickness over the entire surface of the wafer. Also, for forming the resist film in a uniform thickness over the entire surface of the wafer, it is important to control strictly the discharging rate and the discharging time of the resist solution in addition to the rotating speed and the rotating time of the wafer W.

It was customary in the past to supervise the thickness and the thickness distribution of the resist film by controlling the coating device, etc. with a software.

However, in the conventional resist solution supply mechanism, resist discharging nozzles of a plurality of resist coating process units are connected to a single resist solution discharging pump, with the result that, because of the installing conditions such as the difference in head, the discharging rate and the discharging timing of the resist solution tend to be rendered nonuniform depending on the resist solution discharging nozzle used even if the resist solution is discharged on the basis of the same recipe. The discharging rate and the discharging timing of the resist solution are also rendered nonuniform by the individual variation of the resist solution discharging pump. Such a nonuniformity in the discharging rate, etc., was not handled as a serious problem in the past. However, a prominent progress is being achieved in recent years in the miniaturization of the semiconductor device and in the enlargement in the diameter of the semiconductor substrate to be process. In this connection, very high levels of the demands for the accuracy in the thickness of the resist film and for the uniformity of the resist film thickness are being raised nowadays. It follows that even the nonuniformity in the discharging rate of the resist solution caused by the difference in head and by the individual variation has come to affect seriously the thickness and the uniformity of the thickness of the resist film. It should also be noted that the reduction in the discharging amount of the resist solution (resist saving) is being promoted so as to affect the change in the discharging amount and the change in the discharging rate of the resist solution.

BRIEF SUMMARY OF THE INVENTION

A first object of the present invention is to provide a process liquid supply mechanism and a process liquid supply method, which permit controlling the discharging rate of a process liquid such as a resist solution with a high accuracy.

According to a first aspect of the present invention, there is provided a process liquid supply mechanism for supplying a process liquid, comprising a process liquid supply source for supplying a process liquid; a process liquid discharging nozzle for discharging the process liquid; a pipe connecting the process liquid supply source to the process liquid discharging nozzle; a pump mounted to the pipe for allowing the process liquid to be discharged from the process liquid discharging nozzle; a pressure sensor for detecting the pressure of the process liquid at a prescribed position intermediate between the pump and the process liquid discharging nozzle; and a controller for controlling the inner pressure of the pump based on the pressure value detected by the pressure sensor and the relationship obtained in advance between the pressure and the discharging rate of the process liquid such that the process liquid is discharged at a prescribed discharging rate.

According to a second aspect of the present invention, there is provided a process liquid supply mechanism for supplying a process liquid, comprising a process liquid supply source for supplying a process liquid; a plurality of process liquid discharging nozzles which are selectively allowed to discharge the process liquid; piping including a main pipe extending from the process liquid supply source and a plurality of subsidiary pipes branched from the main pipe so as to reach the plural process liquid supply nozzles; a pump mounted to the main pipe for allowing the process liquid to be discharged from the process liquid discharging nozzles; a plurality of pressure sensors for detecting respectively the pressures of the process liquid in the vicinity of the plural process liquid discharging nozzles; and a controller for controlling the inner pressure of the pump in allowing the process liquid to be discharged from each of the process liquid discharging nozzles such that the pressure values detected by the plural pressure sensors mounted in the vicinity of the plural process liquid discharging nozzles are rendered substantially equal to each other.

According to a third aspect of the present invention, there is provided a process liquid supply method, in which a pump is driven so as to permit a process liquid in a process liquid supply source to be supplied into a process liquid discharging nozzle through a pipe for allowing the process liquid to be discharged from the process liquid discharging nozzle, comprising the steps of driving the pump so as to supply the process liquid from the process liquid supply source into the pipe; detecting the pressure of the process liquid at a prescribed position intermediate between the pump and the process liquid discharging nozzle; and controlling the inner pressure of the pump based on the detected value of the pressure of the process liquid and the relationship obtained in advance between the pressure and the discharging rate of the process liquid such that the process liquid is discharged from the process liquid discharging nozzle at a prescribed discharging rate.

Further, according to a fourth aspect of the present invention, there is provided a process liquid supply method, in which a pump is driven so as to permit a process liquid in a process liquid supply source to be supplied through piping into a plurality of process liquid discharging nozzles for selectively allowing the plural process liquid discharging nozzles to discharge the process liquid, comprising the steps of driving the pump for supplying the process liquid from the process liquid supply source into the piping; and detecting the pressures of the process liquid in the vicinity of the plural process liquid discharging nozzles for controlling the inner pressure of the pump such that the detected values of pressures of the process liquid are rendered substantially equal to each other.

In the conventional supply mechanism of a process liquid such as a resist solution, the nonuniformity in the discharging rate caused by the individual variation of the pump or the nozzle connected to the same pump was generated regardless of the operation that the discharging rate of the process liquid was strictly controlled based on a prescribed recipe. As a result of an extensive research conducted in an effort to find the cause of the difficulty, it has been found that the nonuniformity in the discharging rate of the process liquid is derived from the difference in pressure of the process liquid.

Under the circumstances, in the technique according to the first and third aspects of the present invention, the pressure of the process liquid is detected at a prescribed position intermediate between the pump and the process liquid discharging nozzle, and the inner pressure of the pump is controlled based on the detected value of the pressure of the process liquid and the relationship obtained in advance between the pressure and the discharging rate of the process liquid such that the discharging rate of the process liquid is allowed to have a prescribed value, as described above. The particular technique of the present invention permits effectively suppressing the nonuniformity in the discharging rate of the process liquid derived from the difference in pressure of the process liquid.

Also, in the technique according to the second and fourth aspects of the present invention, the pressures of the process liquid in the vicinity of a plurality of process liquid discharging nozzles are detected, and the inner pressure of the pump is controlled such that the detected values of the pressures are rendered substantially equal to each other, as described above. The particular technique permits effectively suppressing the nonuniformity in the discharging rate of the process liquid derived from the difference in pressure of the process liquid among the plural nozzles.

In the first aspect of the present invention, it is possible to mount the pressure detecting means either to the pump or in the vicinity of the process liquid discharging nozzle. It is also possible to arrange a plurality of process liquid discharging nozzles.

Also, in the technique according to the first and second aspects of the present invention, it is possible for the process liquid supply mechanism to further comprise a switching valve for selectively allowing the process liquid discharging nozzle to discharge the process liquid and to cease to discharge the process liquid as desired.

It is desirable for the pump to include a pressurizing body that is moved by the pressure of a pressurizing medium so as to apply the pressure of the pressurizing medium to the process liquid, thereby allowing the process liquid to be discharged from the process liquid discharging nozzle. It is particularly desirable to use a tubephragm pump as a pump of this type. The inner pressure of the pump can be controlled easily when it comes to the pump including a pressurizing body that exerts pressure of the pressurizing medium to the process liquid so as to allow the process liquid to be discharged from the process liquid discharging nozzle.

DETAILED DESCRIPTION OF THE INVENTION

Some embodiments of the present invention will now be described in detail with reference to the accompanying drawings.

Figure 1:
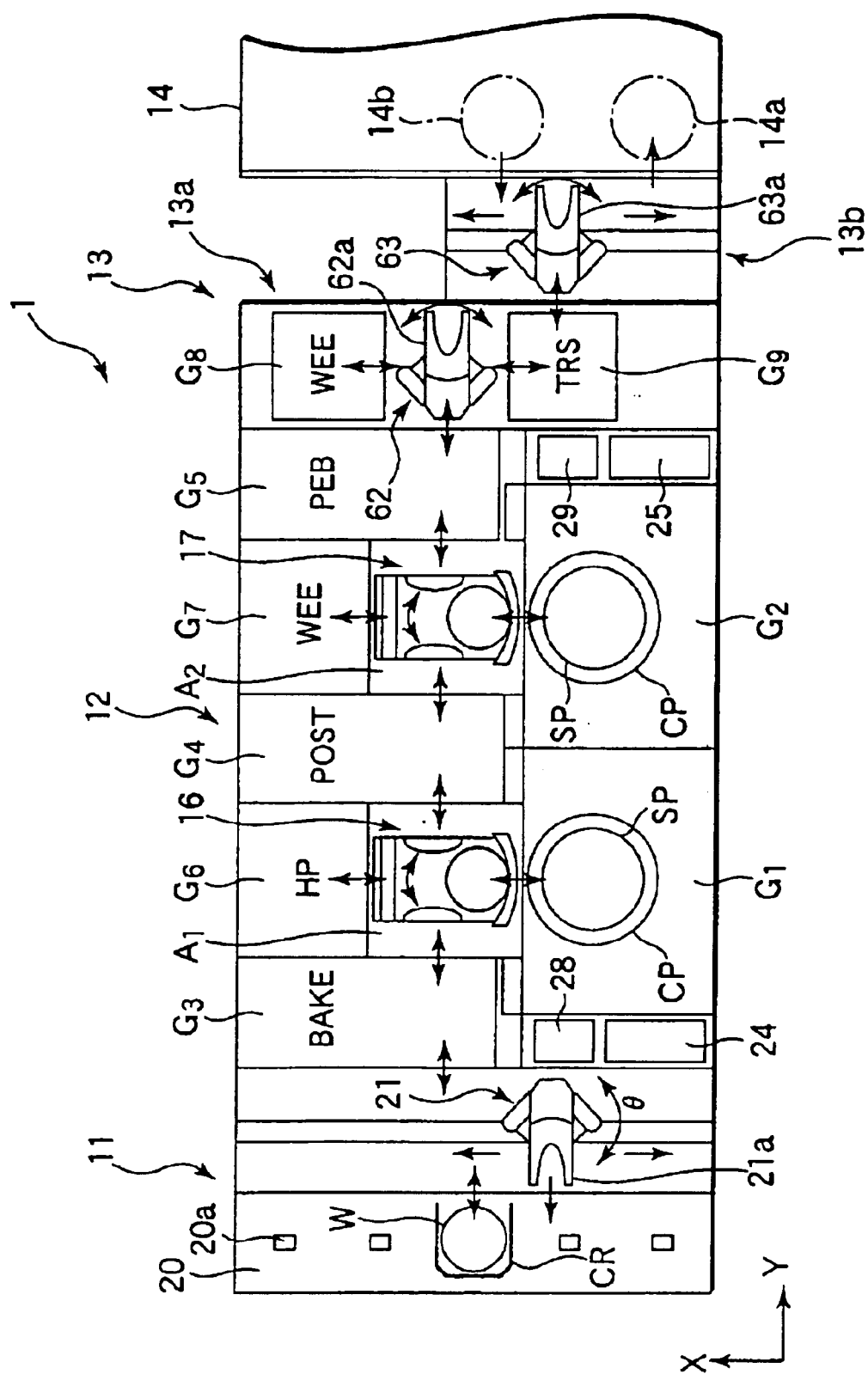
FIG. 1 is a plan view schematically showing the construction of a resist coating-developing system including a resist coating process unit to which is applied the resist solution supply mechanism according to one embodiment of the process liquid supply mechanism of the present invention.
Figure 2:
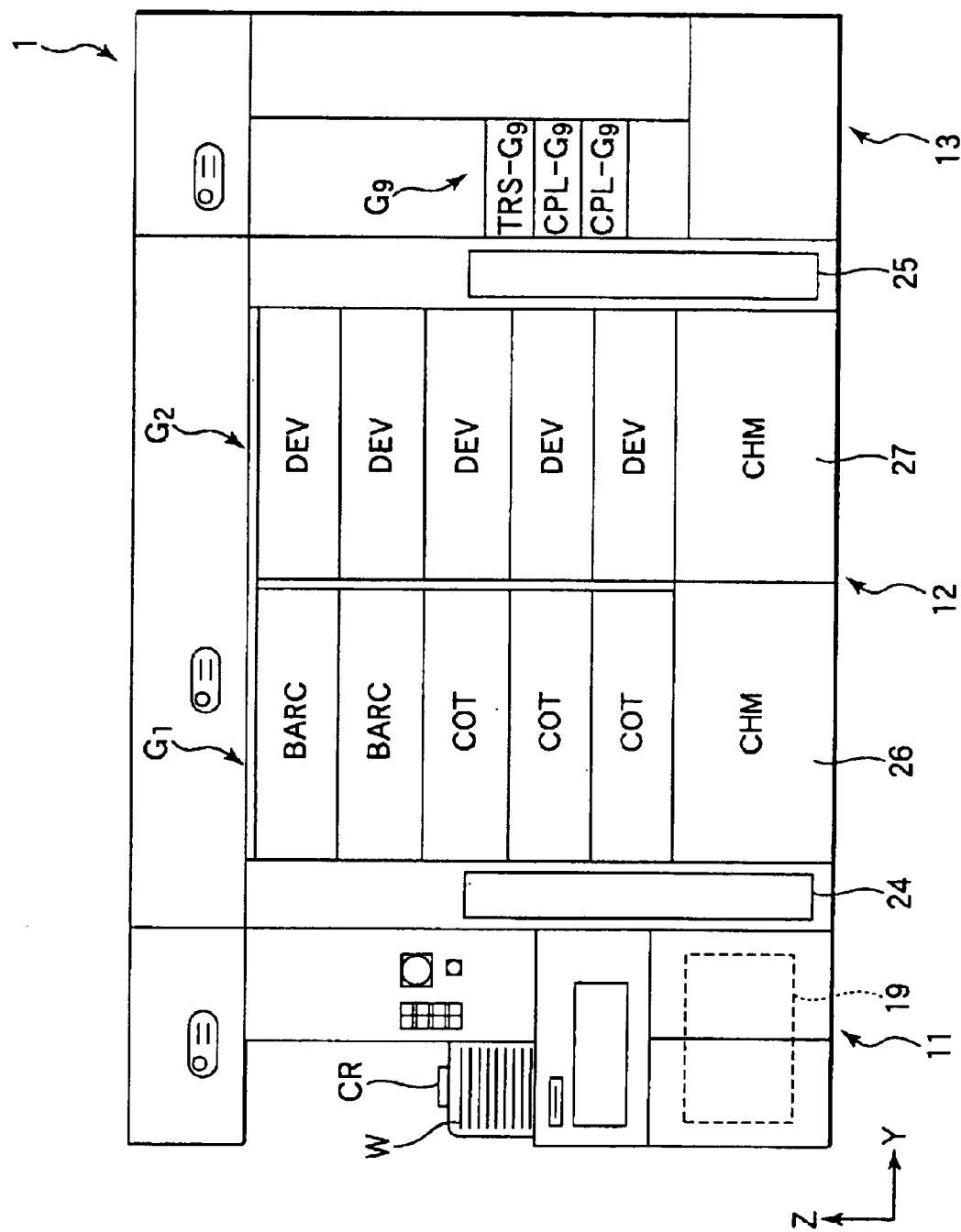
FIG. 2 is a front view schematically showing the construction of the resist coating-developing system shown in FIG. 1.
Figure 3:
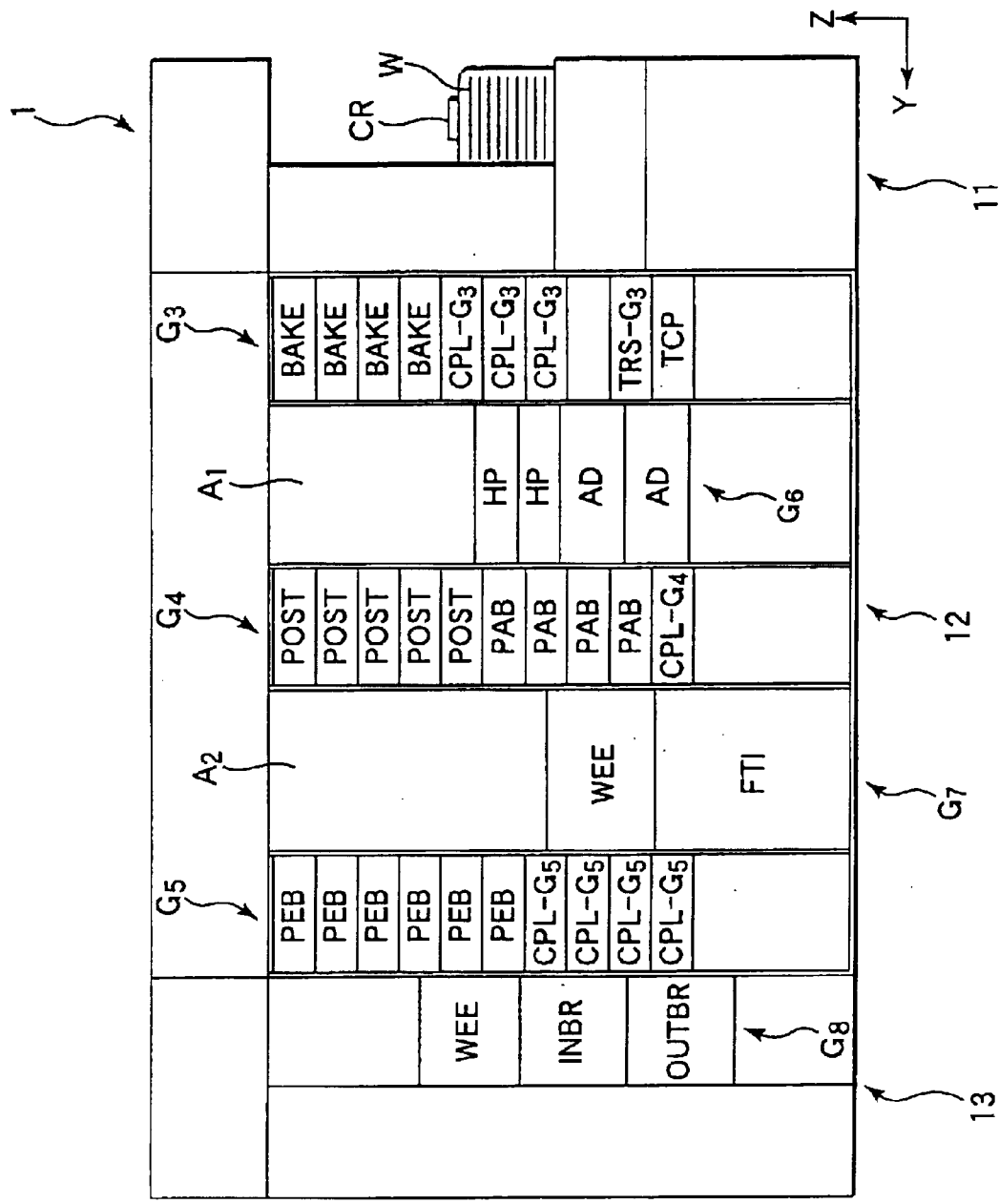
FIG. 3 is a back view schematically showing the construction of the resist coating-developing system shown in FIG. 1.

FIG. 1 is a plan view schematically showing the construction of a resist coating-developing system including a resist coating process unit to which is applied the resist solution supply mechanism according to one embodiment of the process liquid supply mechanism of the present invention, and FIGS. 2 and 3 are a front view and a back view, respectively, of the resist coating-developing system shown in FIG. 1.

The resist coating-developing system 1 comprises a cassette station 11 acting as a transfer station, a process station 12 including a plurality of process units, and an interface station 13 for the delivery of a wafer W between the process station 12 and a light exposure device 14 arranged adjacent to the process station 12.

A cassette CR housing a plurality of wafers W, e.g., 25 wafers W, which are to be processed in the resist coating-developing system 1, is transferred from another system into the cassette station 11. By contraries, the cassette CR housing the wafers W after completion of the processing in the resist coating-developing system 1 is transferred from the cassette station 11 into the other system. Further, the cassette station 11 serves to transfer the wafer W between the wafer cassette CR and the process station 12.

In the cassette station 11, a plurality of projections 20a for determining the positions, i.e., five projections 20a in FIG. 1, are arranged on a cassette table 20 in a manner to form a row extending in an X-direction, as shown in FIG. 1. The wafer cassette CR is disposed in the position of the projection 20a such that the wafer delivery port of the wafer cassette CR is allowed to face the process station 12. Incidentally, within the wafer cassette CR, the wafers W are arranged to assume a horizontal posture and arranged substantially in parallel in the vertical direction (Z-direction), as shown in FIGS. 2 and 3.

A wafer transfer mechanism 21 is arranged in the cassette station 11 so as to be positioned between the cassette table 20 and the process station 12. The wafer transfer mechanism 21 includes a wafer transfer pick 21a movable in the arranging direction of the cassettes CR (X-direction) and in the arranging direction of the wafers W within the wafer cassette CR (Z-direction). The wafer transfer pick 21a is also swingable in the θ-direction shown in FIG. 1. It follows that the wafer transfer pick 21a is capable of gaining access selectively to any of the wafer cassettes CR and to a transition unit (TRS-$G_3$) arranged in a third process unit group $G_3$ included in the process station 12.

In the process station 12, the third process unit group $G_3$, a fourth process unit group $G_4$, and a fifth process unit group $G_5$ are arranged on the back side of the system (in an upper portion in FIG. 1) in the order mentioned as viewed from the cassette station 11. Also, a first main transfer section $A_1$ is arranged between the third process unit group $G_3$ and the fourth process unit group $G_4$. Likewise, a second main transfer section $A_2$ is arranged between the fourth process unit group $G_4$ and the fifth process unit group $G_5$. Further, a first process unit group $G_1$ and a second process unit group $G_2$ are arranged on the front side of the system (lower portion in FIG. 1) in the order mentioned as viewed from the cassette station 11.

As shown in FIG. 3, oven type process units, in which a prescribed processing is applied to the wafer W disposed on a table, are stacked one upon the other so as to form the third process unit group $G_3$. To be more specific, stacked in the third process unit group $G_3$ are high temperature heat treating units (BAKE) for applying a prescribed heat treatment to the wafer W, high precision temperature control units (CPL-$G_3$) for applying a heat treatment to the wafer W under the temperature control of a high precision, a temperature control unit (TCP), and the transition unit (TRS-$G_3$) acting as a delivery section of the wafer W between the cassette station 11 and the first main transfer section $A_1$. These process units are stacked one upon the other to form the third process unit group $G_3$ of, for example, a 10-stage structure. Incidentally, a spare space is formed in the third process unit group $G_3$ so as to be positioned in the third stage from the bottom. It is possible to arrange a desired oven type process unit in the spare space.

Stacked on upon the other in the fourth process unit group $G_4$ are, for example, pre-bake units (PAB) for applying a heat treatment to the wafer W after the resist coating treatment, post-bake units (POST) for applying a heat treatment to the wafer W after the developing treatment, and a high precision temperature control unit (CPL-$G_4$). These process units are stacked one upon the other so as to form the fourth process unit group $G_4$ of, for example, a 10-stage structure. Further, stacked one upon the other in the fifth process unit group $G_5$ are, for example, post-exposure bake units (PEB) for applying a heat treatment to the wafer W after the light exposure and before the developing treatment and high precision temperature control units (CPL-$G_5$). These process units are stacked one upon the other so as to form the fifth process unit group $G_5$ of, for example, a 10-stage structure.

As shown in FIGS. 1 and 3, a sixth process unit group $G_6$ including an adhesion unit (AD) and a heating unit (HP) for heating the wafer W is arranged on the back side of the first main transfer section $A_1$. It is possible to allow the adhesion unit (AD) to have the function of controlling the temperature of the wafer W.

A seventh process unit group $G_7$ including a peripheral light exposure device (WEE) for selectively allowing the edge portion alone of the wafer W to be exposed to light and a thickness measuring device (FTI) for measuring the thickness of the resist film is arranged on the back side of the second main transfer section $A_2$. It is possible to arrange a plurality of peripheral light exposure devices (WEE) to form a multi-stage structure. Also, it is possible to arrange a heat treating unit such as the heating unit (HP) on the back side of the second main transfer section $A_2$ as on the back side of the first main transfer section $A_1$.

As shown in FIGS. 1 and 2, five spinner type process units each constituting a liquid supply unit in which a prescribed treatment is applied to the wafer W disposed on a spin chuck SP within a cup (CP) are arranged to form a first process unit group $G_1$. For example, three resist coating units (COT) and two bottom coating units (BARC) for forming an antireflection film for preventing the light reflection during the light exposure treatment are stacked one upon the other so as to form the first process unit group $G_1$ of, for example, a 5-stage structure. On the other hand, five spinner type process units, e.g., developing units (DEV), are stacked one upon the other so as to form a second process unit group $G_2$ of a 5-stage structure.

A first main wafer transfer device 16 is arranged in the first main transfer section $A_1$. The first main wafer transfer device 16 is capable of selectively gaining access to any of the process units arranged in the first process unit group $G_1$, the third process unit group $G_3$, the fourth process unit group $G_4$, and the sixth process unit group $G_6$. Also, a second main wafer transfer device 17 is arranged in the second main transfer section $A_2$. The second main wafer transfer device 17 is capable of selectively gaining access to any of the process units arranged in the second process unit group $G_2$, the fourth process unit group $G_4$, the fifth process unit group $G_5$, and the seventh process unit group $G_7$.

Figure 4:
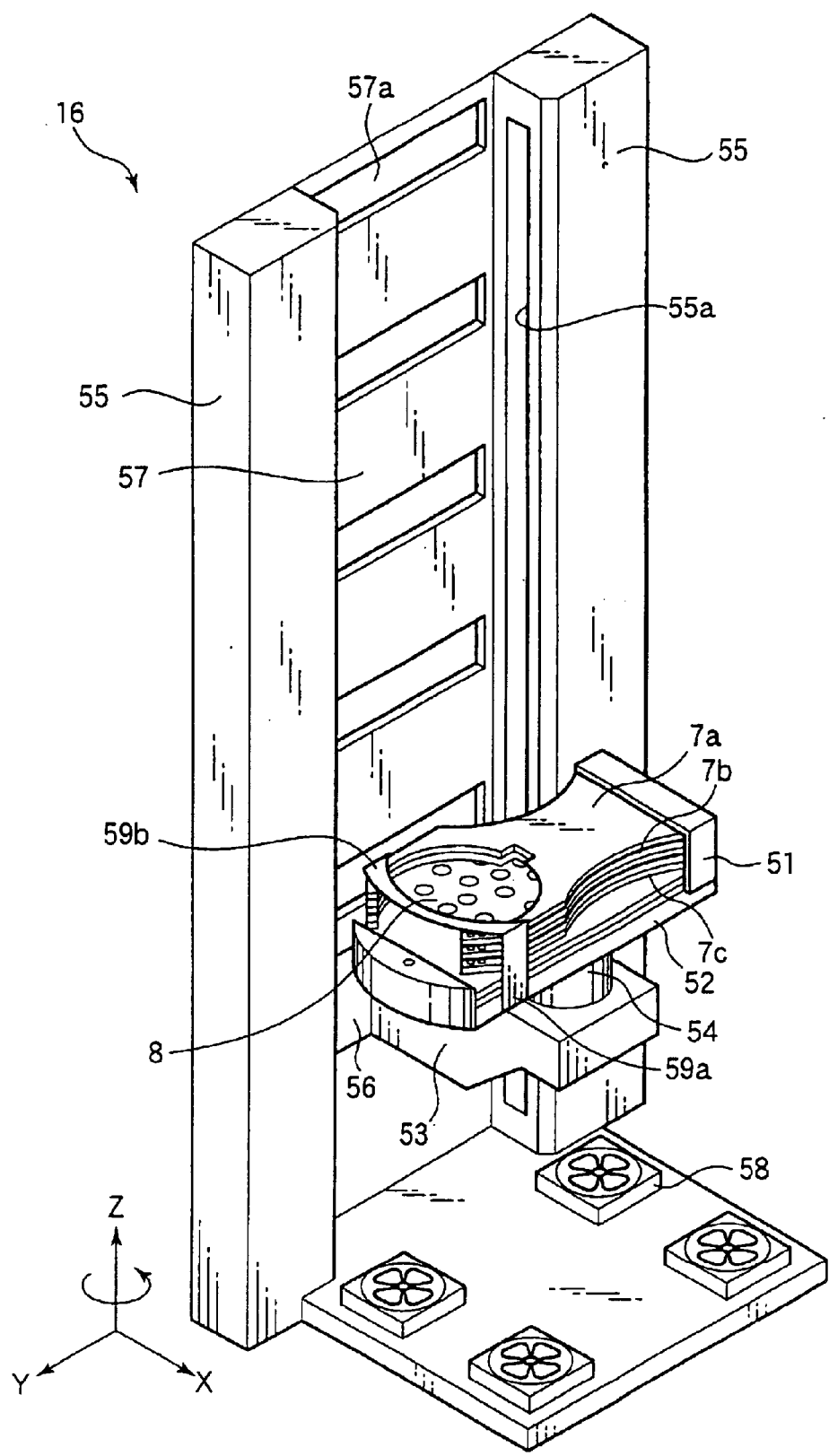
FIG. 4 is an oblique view schematically showing the construction of a main wafer transfer device included in the resist coating-developing system shown in FIG. 1.

FIG. 4 is an oblique view schematically showing the construction of the first main wafer transfer device 16. As shown in the drawing, the first main wafer transfer device 16 comprises three arms, i.e., an arm 7a in the upper stage, an arm 7b in the middle stage and an arm 7c in the lower stage, an arm support plate 51 mounted to the proximal end portion of each of the arms 7a to 7c (the support plate 51 mounted to the arm 7a alone being shown in the drawing), a base 52 engaged with each of the arm support plates 51, a support section 53 for supporting the base 52, etc., a motor (not shown) housed within the support section 53, a rotatable rod 54 for joining the base 52 to the motor, support rods 55 arranged on the sides of the first process unit group $G_1$ and the second process unit group $G_2$ and each having a sleeve 55a formed therein in a manner to extend in the vertical direction, a flange member 56 slidably engaged with the sleeve 55a and joined to the support section 53, and a lift mechanism (not shown) for moving the flange member 56 in the vertical direction.

Rails (not shown) for the arm support plates 51 are formed on the base 52 in a manner to extend in the direction parallel to the longitudinal direction of the base 52 so as to permit each of the arm support plates 51 to be slidable along the rail. Also, if the motor arranged within the support section 53 is rotated, the rotatable rod 54 is rotated so as to permit the base 52 to be rotated within an X-Y plane. Further, since the support section 53 is mounted to the flange member 56 movable in the Z-direction, the base 52 is also movable in the Z-direction.

Because of the particular construction described above, the arms 7a to 7c of the first main wafer transfer device 16 are movable in any of the X-direction, the Y-direction and the Z-direction, with the result that these arms 7a to 7c are capable of gaining access to any of the process units included in the first process unit group $G_1$, the third process unit group $G_3$, the fourth process unit group $G_4$, and the sixth process unit group $G_6$ as described previously.

Vertical members 59a are mounted to both sides in the tip portion of the base 52. Also, a shielding plate 8 positioned between the arm 7a and the arm 7b for shielding the heat radiated from these arms 7a, 7b is mounted to these vertical members 59a. Further, a bridging member 59b is mounted between these vertical members 59a. A pair of optical sensors (not shown) are mounted to the center of the bridging member 59b and to the tip portion of the base 52 so as to make it possible to confirm the presence or absence of the wafer W on each of the arms 7a to 7c and to confirm the protrusion of the wafer W from any of these arms 7a to 7c. It should be noted that the second main wafer transfer device 17 is substantially equal in construction to the first main wafer transfer device 16 described above.

Incidentally, a wall section 57 shown in FIG. 4 constitutes a part of the housing of the second main wafer transfer section $A_2$ on the side of the first process unit group $G_1$. A window section 57a formed in the wall section 57 facilitates the wafer delivery between the process units included in the first process unit group $G_1$. Also, four fans 58 arranged on the bottom portion of the second main wafer transfer section $A_2$ serve to control the pressure, temperature and humidity within the second main wafer transfer section $A_2$.

A liquid temperature control pump 24 for supplying a prescribed process liquid to the first process unit group $G_1$ is arranged between the first process unit group $G_1$ and the cassette station 11. Likewise, a liquid temperature control pump 25 for supplying a prescribed process liquid to the second process unit group $G_2$ is arranged between the second process unit group $G_2$ and the interface section 13. Further, arranged are ducts 28, 29 for supplying a clean air from an air conditioner (not shown) arranged outside the resist coating-developing system 1 into the process unit groups $G_1$ to $G_5$.

The first process unit group $G_1$ to the seventh process unit group $G_7$ are detachable for the maintenance operation. Also, the panel on the back side of the process station 12 is detachable or openable. Chemical units (CHM) 26 and 27 for supplying a prescribed process liquid to the first process unit group $G_1$ and the second process unit group $G_2$ are arranged in the lowermost stages of the first process unit group $G_1$ and the second process unit group $G_2$, respectively. Further, a central control section 19 for controlling the entire resist coating-developing system 1 is arranged in a lower portion of the cassette station 11.

The interface station 13 comprises a first interface station 13a on the side of the process station 12 and a second interface station 13b on the side of the light exposure device 14. A first wafer transfer body 62 is arranged in the first interface section 13a in a manner to face the open portion of the fifth process unit group $G_5$, and a second wafer transfer body 63 movable in the X-direction is arranged in the second interface station 13b.

Arranged on the back side of the first wafer transfer body 62 is an eighth process unit group $G_8$ including a peripheral light exposure device (WEE), an in-buffer cassette (INBR) for temporarily housing the wafer W that is to be transferred into the light exposure device 14, and an out-buffer cassette (OUTBR) for temporarily housing the wafer W transferred out of the light exposure device 14. These process units are stacked one upon the other in the order mentioned as viewed from above. A plurality of wafers W, e.g., 25 wafers W, can be housed in each of the in-buffer cassette (INBR) and the out-buffer cassette (OUTBR). Also, arranged on the front side of the first wafer transfer body 62 is a ninth process unit $G_9$ including a transition unit (TRS-$G_9$) and two high precision temperature control units (CPL-$G_9$), which are stacked one upon the other in the order mentioned as viewed from above.

The first wafer transfer body 62 is provided with a fork 62a movable in the Z-direction, swingable in the θ-direction and movable back and forth within an X-Y plane. The fork 62a is capable of gaining access to any of the process units included in the fifth process unit group $G_5$, the eighth process unit group $G_8$, and the ninth process unit group $G_9$ so as to make it possible to transfer the wafer W between the process units included in these process unit groups.

The second wafer transfer body 63 is movable in the X-direction and Z-direction, swingable in the θ-direction and provided with a fork 63a movable back and forth within an X-Y plane for delivering the wafer W. The fork 63a is capable of gaining access to each of the process units included in the ninth process unit group $G_9$, and to an in-stage 14a and an out-stage 14b included in the light exposure device 14 so as to make it possible to transfer the wafer W among these members.

In the resist coating-developing system 1 of the construction described above, unprocessed wafers W are taken out one by one from the wafer cassette CR by the wafer transfer mechanism 21 so as to be transferred into the transition unit (TRS-$G_3$). Then, after a temperature control treatment is applied to the wafer W in the temperature control unit (TCP), an antireflection film is formed on the wafer W in the bottom coating unit (BARC) belonging to the first process unit group $G_1$, followed by applying a heat treatment to the wafer W in the heating unit (HP) and subsequently applying a baking treatment to the wafer W in the high temperature heat treating unit (BAKE). It is possible to apply an adhesion treatment to the wafer W in the adhesion unit (AD) before formation of the antireflection film on the wafer W in the bottom coating unit (BARC). It is also possible to apply an adhesion treatment to the wafer W without forming an antireflection film on the wafer W. Then, after the temperature of the wafer W is controlled in the high precision temperature control unit (CPL-$G_4$), the wafer W is transferred into the resist coating unit (COT) belonging to the first process unit group $G_1$ for application of the coating treatment with a resist solution. Further, a pre-bake treatment is applied to the wafer W in the pre-bake unit (PAB) arranged in the fourth process unit group $G_4$, followed by applying a peripheral light exposure treatment to the wafer W in the peripheral light exposure device (WEE) and subsequently controlling the temperature of the wafer W in the high precision temperature control unit (CPL-$G_9$), etc. Then, the wafer W is transferred by the second wafer transfer body 63 into the light exposure device 14. The exposed wafer W in the light exposure device 14 is transferred by the second wafer transfer body 63 into the transition unit (TRS-$G_9$) and, then, further transferred by the first wafer transfer body 62 into the post-exposure bake unit (PEB) belonging to the fifth process group $G_5$ for application of the post-exposure bake treatment to the wafer W. Further, the wafer W is transferred into the developing unit (DEV) belonging to the second process unit group $G_2$ for developing the wafer W, followed by applying a post-bake treatment to the wafer W in the post-bake unit (POST). Still further, a temperature control treatment is applied to the wafer W in the high precision temperature control unit (CPL-$G_3$), followed by transferring the wafer W onto a prescribed position within the wafer cassette CR arranged in the cassette station 11 through the transition unit (TRS-$G_3$).

The resist coating process unit (COT) to which is applied one embodiment of the present invention will now be described with reference to FIGS. 5 to 9.

Figure 5:
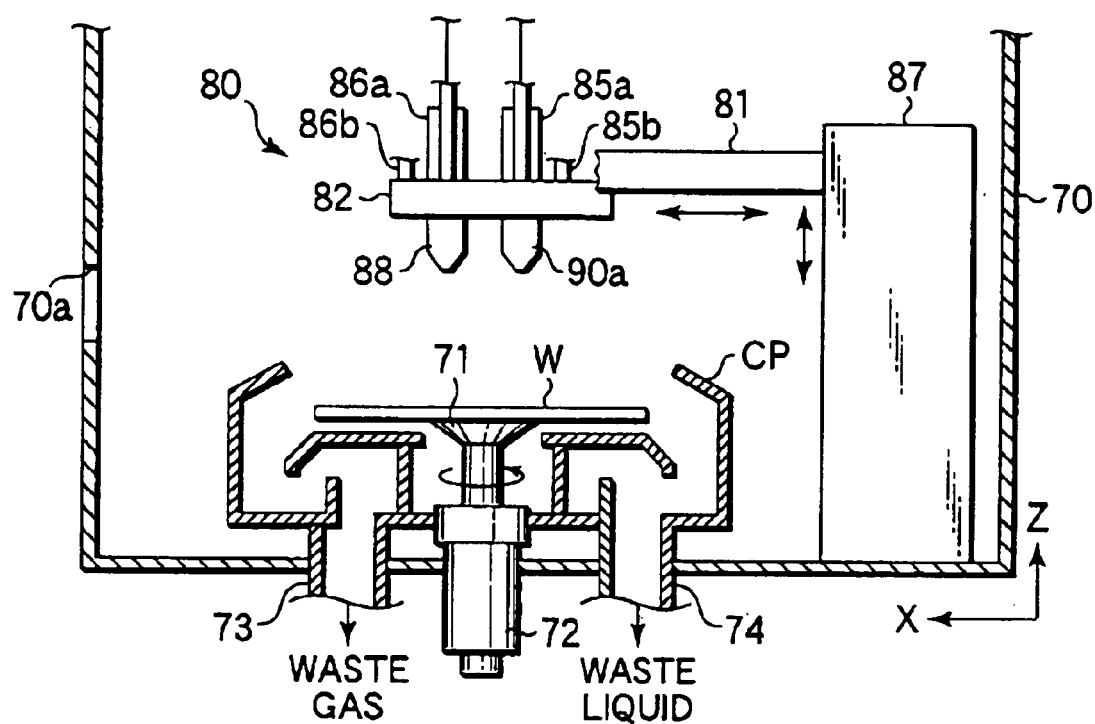
FIG. 5 is a cross sectional view showing the entire construction of the resist coating process unit mounted in the resist coating-developing system shown in FIG. 1.

As described above, three resist coating process units (COT) are stacked one upon the other in the first process unit group $G_1$ to form a three-stage structure. The resist coating process unit (COT) in the uppermost stage will now be described. As shown in FIG. 5, the resist coating process unit (COT) in the uppermost stage comprises a casing 70 provided with an opening 70a through which the arms 7a to 7c of the first main wafer transfer device 16 are inserted into the casing 70. A cup CP having the wafer W housed therein is arranged within the casing 70, and a spin chuck 71 for horizontally holding the wafer W by means of vacuum suction is arranged within the cup CP. The spin chuck 71 can be rotated by a driving motor 72 such as a pulse motor mounted below the cup CP. The rotating speed of the spin chuck 71 can be controlled optionally. An exhaust pipe 73 is connected to that region of the bottom portion of the cup CP which is positioned close to the center of the bottom portion of the cup CP. Also, a waste liquid discharge pipe 74 is connected to that region of the bottom portion of the cup CP which is positioned close to the outer periphery of bottom portion of the cup CP. The gas within the cup CP is discharged to the outside through the exhaust pipe 73. On the other hand, the resist solution and the solvent scattered during the coating process are discharged to the outside through the waste liquid discharge pipe 74. Incidentally, the spin chuck 71 can be moved in the vertical direction by a lift mechanism such as an air cylinder (not shown).

Figure 6:
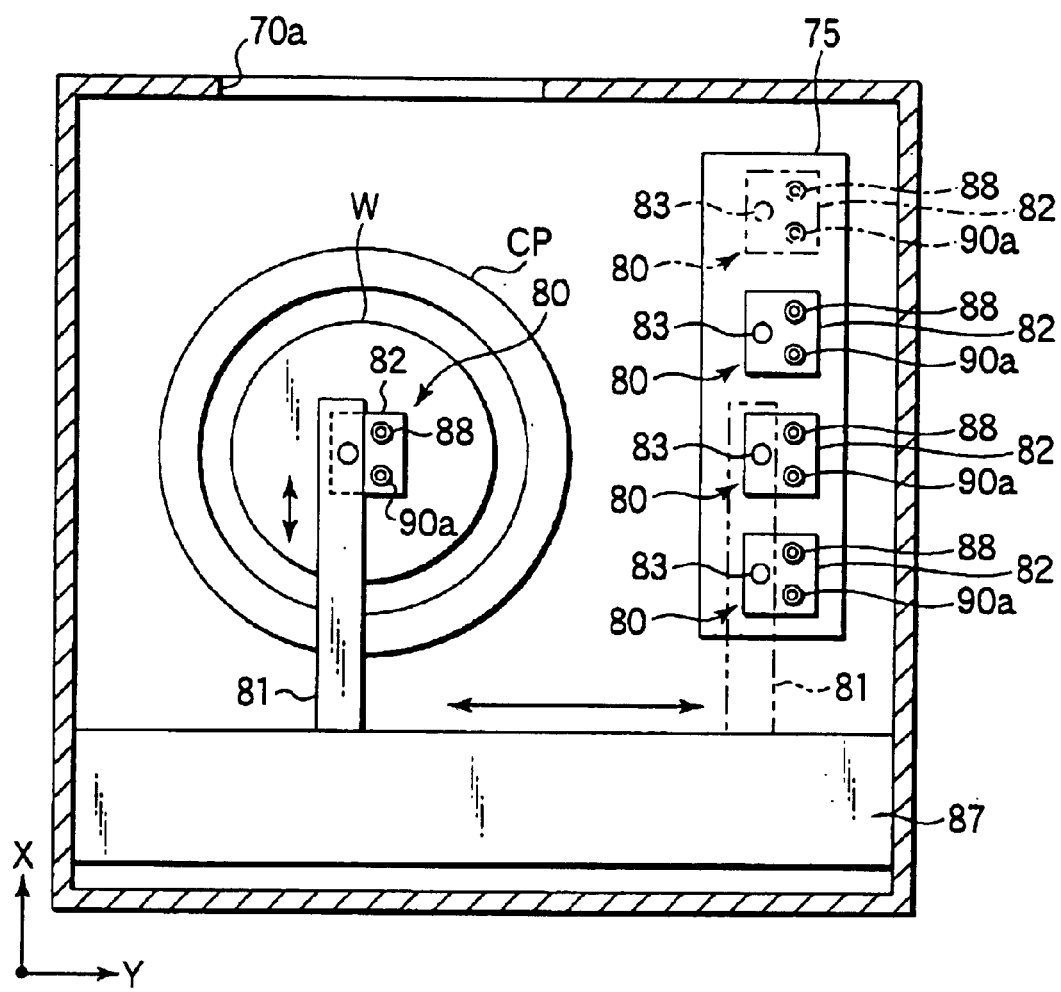
FIG. 6 is a plan view showing the resist coating process unit shown in FIG. 5.

As shown in FIG. 6, a holding section 75 capable of holding four discharging heads 80, which basically have the same construction, is arranged outside the cup CP within the casing 70. Each of these discharging heads 80 includes a solvent discharging nozzle 88 for discharging a solvent capable of dissolving a resist solution and a resist solution discharging nozzle 90a for discharging a resist solution constituting the coating solution. These solvent discharging nozzle 88 and resist solution discharging nozzle 90a are mounted close to each other to a base member 82. It is possible for the solvent capable of dissolving the resist solution, which permits improving the wettability of the resist solution so as to decrease the resist consumption, to be a solvent of the resist solution. It is also possible to use any kind of the solvent as far as the solvent is capable of dissolving the resist coating solution, and a thinner is used typically as the solvent capable of dissolving the resist solution. Incidentally, an inserting section (not shown) for putting the nozzle port of each nozzle under a solvent atmosphere is formed in the holding section 75 for preventing the nozzle port of each nozzle from being dried and solidified.

Any of these discharging heads 80 can be mounted to the tip portion of an arm 81 by a mounting section 83 such that different kinds of the resist solutions can be discharged onto the surface of the wafer W. The selected one of the discharging heads 80, which is mounted to the arm 81, can be moved by a driving mechanism 87 in any of the X-, Y- and Z-directions shown in FIGS. 5 and 6 so as to permit the discharging head 80 mounted to the arm 81 to be movable between a position right above the spin chuck 71 and a retreat position.

As shown in FIG. 5, mounted to the discharging head 80 are tubes 85a, 85b for circulating a temperature control fluid for the temperature control such that the temperature of the resist solution discharged from the resist solution discharging nozzle is maintained constant and tubes 86a, 86b for circulating a temperature control fluid for the temperature control such that the temperature of the solvent discharged from the solvent discharging nozzle 88 is maintained constant. The tube 85a is arranged to surround the pipe communicating with the resist solution discharging nozzle 90a so as to constitute a going passageway, and the tube 85b constitutes a return passageway. Also, tube 86a is arranged to surround the pipe communicating with the solvent discharging nozzle 88 so as to constitute a going passageway, and the tube 86b constitutes a return passageway.

Incidentally, in the embodiment shown in the drawing, the solvent discharging nozzle 88 and the resist solution discharging nozzle 90a are mounted together to each discharging head 80. Alternatively, it is also possible to mount the resist solution discharging nozzle 90a alone to each discharging head 80 and to mount a single solvent discharging nozzle, which is commonly used for the four discharging heads 80. In this case, it is possible to mount separately an arm for driving the solvent discharging nozzle. It is also possible to mount in advance the solvent discharging nozzle to the arm 81 and to move the arm 81 integrally with the selected one of the discharging heads 80.

The resist coating process units (COT) in the second and third stages from above is basically equal in construction to the uppermost stage resist coating process unit (COT) described above. The same kind of the resist solution is supplied to these three stages of the resist coating process units (COT) by using a common resist solution supply mechanism.

The resist solution supply mechanism will now be described with reference to FIG. 7. As described above, the resist coating process unit (COT) in the uppermost stage includes the resist solution discharging nozzle 90a. On the other hand, the resist coating process units (COT) in the second and third stages from above include resist solution discharging nozzles 90b and 90c, respectively. The resist solution supply mechanism 100 shown in FIG. 7 includes all of these resist solution discharging nozzles 90a, 90b and 90c.

The resist solution supply mechanism 100 includes a bottle 101 storing a resist solution L1 and, thus, acting as a resist solution supply source, a buffer tank 102 for temporarily storing the resist solution L1 supplied from the bottle 101, a pump 103 for supplying the resist solution from the bottle 101 into the resist solution discharging nozzles 90a, 90b and 90c, and a filter 104 for removing the dust particles from the resist solution L1. A $N_2$ gas pipe 110 for supplying a $N_2$ gas acting as a pressurizing gas is connected to an upper portion of the bottle 101, and an air operation valve 111 is mounted to the pipe 110. Also, a valve 116 for releasing the pressure inside the bottle 101 in, for example, replacing the bottle 101 is connected to an upper portion of the bottle 101. Further, a resist solution feeding pipe 112 is inserted from above the bottle 101 into the bottle 101 so as to permit the tip portion of the pipe 112 to be dipped in the resist solution L1, and an air operation valve 113 is mounted to the resist solution feeding pipe 112. The resist solution feeding pipe 112 is inserted from above the buffer tank 102 into the buffer tank 102. It follows that the resist solution L1 within the bottle 101 is supplied into the buffer tank 102 by the pressure of the $N_2$ gas supplied from the $N_2$ gas pipe 110.

A liquid level sensor 117 for detecting the surface level of the resist solution within the buffer tank 102 is arranged sideward of the buffer tank 102. The liquid level sensor 117 includes a full sensor 117a for detecting that the buffer tank 102 is filled completely with the resist solution, an empty sensor 117b for detecting that the buffer tank 102 is empty, a semi-full sensor 117c arranged between the full sensor 117a and the empty sensor 117b for detecting that the buffer tank 102 is immediately before the state of being filled completely with the resist solution, and a semi-empty sensor 117d arranged between the semi-full sensor 117c and the empty sensor 117b for detecting that the buffer tank 102 is immediately before the state of being rendered empty.

A resist solution feeding pipe 114 is connected to the bottom portion of the buffer tank 102 at one end and to the pump 103 at the other end. A check valve 133 is mounted to the resist solution feeding pipe 114 in the vicinity of the pump 103. Also, a resist solution feeding pipe 115 is connected to the discharge side of the pump 103, and an air operation valve 134 is mounted to the resist solution feeding pipe 115 in the vicinity of the pump 103. The filter 104 referred to previously is also mounted to the resist solution feeding pipe 115. The pipe 115 is branched into branched pipes 115a, 115b and 115c, and the nozzles 90a, 90b and 90c are mounted to the tip portions of these branched pipes 115a, 115b and 115c, respectively. It follows that the resist solution L1 within the buffer tank 102 is supplied through the resist solution feeding pipes 114 and 115 into any of the branched pipes 115a, 115b and 115c in accordance with the driving of the pump 103 so as to permit the resist solution to be discharged from the corresponding resist solution discharging nozzle.

Air operation valves 121a, 121b, 121c and suck back valves 122a, 122b, 122c are mounted to the branched pipes 115a, 115b, 115c, respectively. It should be noted that the air operation valves 121a, 121b, 121c are opened or closed so as to turn on or off the discharging of the resist solution from the resist solution discharging nozzles 90a, 90b, 90c through the branched pipes 115a, 115b, 115c. It should also be noted that the suck back valves 122a, 122b, 122c suck the resist solution remaining on the inner wall section at the tip portion of each of the resist solution discharging nozzles 90a, 90b, 90c after the discharging of the resist solution back into the resist solution discharging nozzles 90a, 90b, 90c so as to prevent the remaining resist solution from being solidified.

An air releasing pipe 123 is connected to an upper portion of the buffer tank 102, and an air operation valve 124 is mounted to the air releasing pipe 123. Also, a bubble removing section is formed in the pump 103, as described herein later. The resist solution discharged through the bubble removing section is brought back into the buffer tank 102 through a recovery pipe 125. A bubble removing section (not shown) is also formed in the filter 104 so as to permit the resist solution discharged through the bubble removing section to be brought back into the buffer tank 102 through a recovery pipe 127. The recovery pipe 127 is connected to the recovery pipe 125, and air operation valves 126 and 128 are mounted to the recovery pipes 125 and 127, respectively. Also, the recovery pipe 127 is connected to the resist solution feeding pipe 115 by a pipe 129. An air operation valve 130 is mounted to the pipe 129. The bubble removing sections thus formed permit recovering the discharged resist solution so as to suppress the entry of the bubbles into the resist solution and to suppress the interference of the pressure caused by the bubble. In addition, the consumption of the resist solution can be decreased.

A pressure sensor 131 is mounted to the pump 103. Also, pressure sensors 132a, 132b, 132c are mounted on the upstream side of the air operation valves 121a, 121b, 121c mounted to the branched pipes 115a, 115b, 115c, respectively. The signals detected by these pressure sensors 131, 132a, 132b, 132c are supplied to a controller 135. Upon receipt of the detected signals, the controller 135 performs a prescribed arithmetic calculation based on the detected signals so as to transmit a control signal to the pump 103, with the result that the inner pressure of the pump 103 is controlled.

Figure 8:
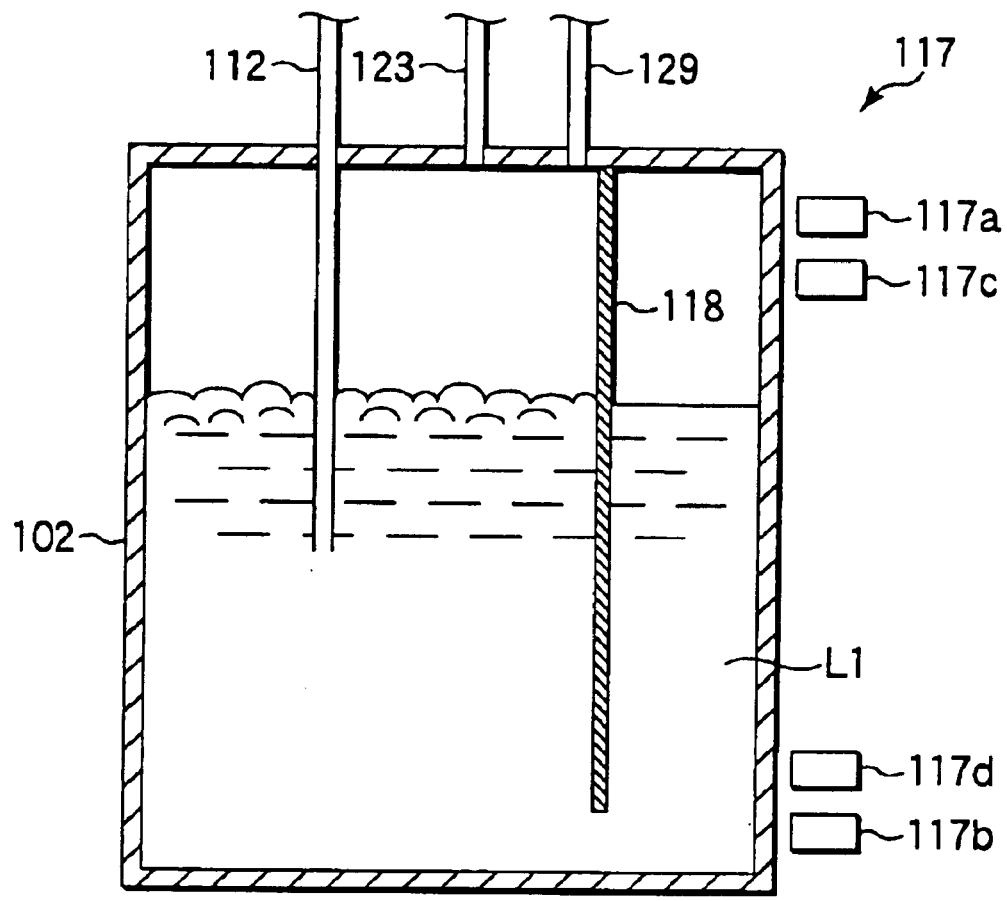
FIG. 8 is a cross sectional view showing another example of the buffer tank used in the resist solution supply mechanism shown in FIG. 7.

Incidentally, it is possible for an activating agent to be contained in the resist solution. In this case, the resist solution tends to be foamed within the buffer tank 102 and, thus, the liquid level sensor 117 tends to detect erroneously the surface of the resist solution. In order to suppress such an erroneous detection, it is effective to arrange a partition plate 118, as shown in FIG. 8. Since the foaming occurs mainly when the resist solution is supplied from the resist solution feeding pipe 112 into the buffer tank 102, it is desirable to mount the partition plate 118 in a manner to extend in a vertical direction in that region within the buffer tank 102 which is positioned on the side of the liquid level sensor 117 as shown in the drawing. In this case, the bubbles generated in the resist solution supply portion are shielded by the partition plate 118 so as to prevent the bubbles from flowing into the region on the side of the liquid level sensor 117. It follows that it is possible to prevent the liquid level sensor 117 from detecting the liquid level erroneously.

The construction of the pump 103 will now be described.

It is desirable for the pump 103 to include a pressurizing body that is moved by the pressure of a pressurizing medium so as to allow the pressure of the pressurizing medium to be exerted on the process liquid, thereby allowing the process liquid to be discharged from the process liquid discharging nozzle. The embodiment shown in the drawing is directed to a tubephragm pump constituting a typical example of the particular pump.

Figure 9:
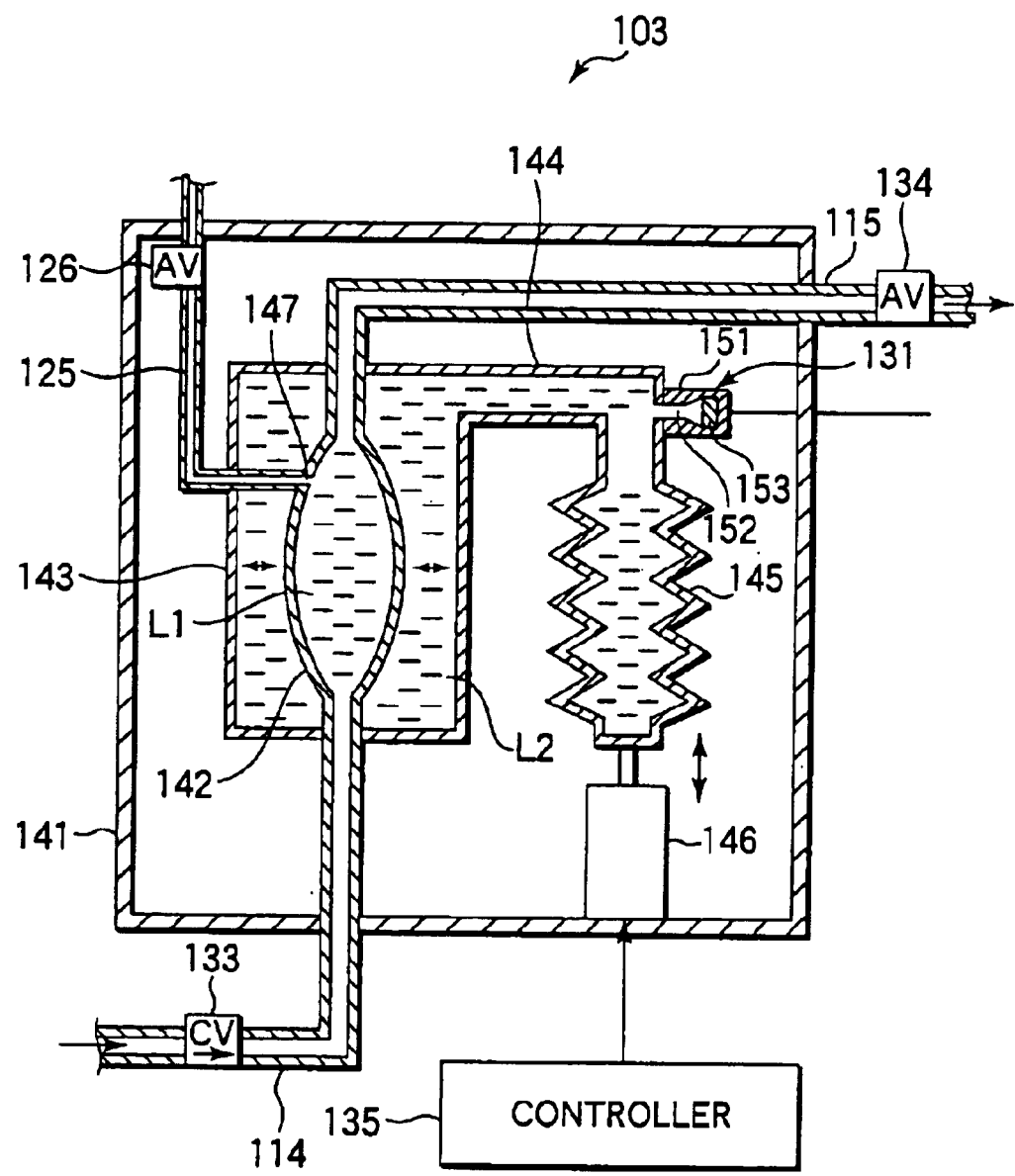
FIG. 9 is a cross sectional view showing the pump used in the resist solution supply mechanism shown in FIG. 7.

FIG. 9 is a cross sectional view showing the construction of the pump 103. As shown in the drawing, the pump 103 comprises a casing 141. A tubephragm 142 to which the resist solution feeding pipes 114 and 115 referred to previously are connected is arranged within the casing 141. The tubephragm 142, in which the resist solution L1 is stored, is movable in the horizontal direction as denoted by arrows.

The tubephragm 142 is housed in a container 143 that is filled with a pressurizing medium L2. A bellows 145 is connected to the container 143 via a pipe 144. The pipe 144 and the bellows 145 are also filled with the pressurizing medium L2. A driving section 146 is connected to the bellows 145 such that the bellows 145 is elongated or shrunk by the operation of the driving section 146. If the driving section 146 is operated to push upward the bellows 145, the pressurizing medium is pressurized so as to exert pressure to the tubephragm 142. As a result, the resist solution L1 within the tubephragm 142 is supplied through the resist solution feeding pipe 115 into any of the resist solution discharging nozzles. By contraries, if the driving section 146 is operated to elongate the bellows 145, the tubephragm 142 is expanded so as to permit the resist solution L1 within the buffer tank 102 to be supplied into the tubephragm 142 through the resist solution feeding pipe 114. The driving section 146 is operated in response to a pulse supplied from the controller 135. The pressure sensor 131 is mounted to the pipe 144 for the pressurizing medium L2. The pressure sensor 131 includes a sensor body 151, a guide path 152 for guiding the pressurizing medium L2 into the sensor body 151, and a sensor element 153 mounted to the tip portion of the guide path 152 so as to detect directly the pressure of the pressurizing medium L2. The detected pressure value is equal to the pressure exerted on the resist solution L1. A bubble removing section 147 is mounted to the tubephragm 142, and the recovery pipe 125 referred to previously is connected to the bubble removing section 147. Also, the resist solution discharged when the bubbles are removed from the bubble removing section is recovered in the buffer tank 102, as described previously.

In the construction described above, the bellows 145 is elongated or shrunk so as to control the pressure applied by the pressurizing medium L2. Alternatively, it is also possible to employ a plunger system in place of the bellows. Also, the controller 135 controls the devices other than the pump 103 such as the air operation valve, the suck back valve and the driving motor 72, though the description thereof is omitted herein.

The operation and control of the resist solution coating process performed by the resist coating process unit (COT) will now be described.

If the wafer W is transferred by any of the arms 7a to 7c of the first main wafer transfer device 16 to a region right above the cup CP within the resist coating process unit (COT) through the opening 70a of the casing 70, the wafer W is sucked by vacuum suction by the spin chuck 71 moved upward by the lift mechanism (not shown). After the wafer W is held by the spin chuck 71 by vacuum suction, the first main wafer transfer device 16 brings the arm back from within the resist coating process unit (COT), thereby finishing the delivery of the wafer W into the resist coating process unit (COT).

Then, the spin chuck 71 is moved downward until the wafer W held by the spin chuck 71 is positioned at a prescribed position within the cup CP. Under this condition, the spin chuck 71 is rotated by the driving motor 72 at a rotating speed of about 1,000 rpm so as to make uniform the temperature of the wafer W.

Then, the rotation of the spin chuck 71 is stopped, and the discharging head 80 is moved by the driving mechanism 87 in the Y-direction, When the discharging head 80 is moved to reach a position right above the wafer W, a solvent dissolving the resist such as a thinner is supplied onto substantially the center on the surface of the stationary wafer W. Under this condition, a pre-wet treatment for spreading the solvent supplied onto the central region of the surface of the wafer W over the entire surface of the wafer W is carried out by rotating the wafer W at a prescribed rotating speed. Preferably, the wafer W is rotated at a rotating speed not higher than 1,000 rpm. As a result, the wettability of the resist solution can be improved and the amount of the resist discharged onto the wafer can be decreased.

In the next step, the discharging head is moved in the Y-direction by the driving mechanism 87 until the discharging port of the resist solution discharging nozzle 90a (90b, 90c) is moved to reach a position above the center of the spin chuck 71 (i.e., above the center of the wafer W). Then, the rotating speed of the wafer W is increased to a prescribed value, and the resist solution is supplied from the discharging port of the resist solution discharging nozzle onto substantially the center of the surface of the rotating wafer W. As a result, the resist solution is centrifugally diffused outward, thereby performing the resist coating process over the entire surface of the wafer W. In performing the resist coating process, the wafer W is rotated at a relatively high rotating speed in the initial stage while discharging the resist solution onto the central region of the wafer W for centrifugally spreading the resist solution over the entire surface region of the wafer W. It is desirable for the rotating speed of the wafer W in the initial stage to be 2,000 to 6,000 rpm in the case of the wafer having a diameter of 200 mm, and to be 1,000 to 4,000 rpm in the case of the wafer having a diameter of 300 mm. Then, the supply of the resist solution is stopped, and the rotating speed of the wafer W is lowered. As a result, the film thickness adjusting function is produced so as to promote the effect of making uniform the film thickness over the entire region of the wafer W. It should be noted in this connection that, when the rotating speed of the wafer W is lowered, the force directed toward the center of the wafer W is exerted on the resist solution on the wafer W by the deceleration. In addition, since the rotating speed of the wafer W is low, the resist solution on the wafer W is dried slowly. It follows that the function of adjusting the thickness of the resist film is exhibited. To be more specific, the amount of the resist solution scattered toward the outside of the wafer W is suppressed by the force directed toward the center of the wafer W, which is produced by the deceleration. Likewise, the resist solution is held on the outer circumferential portion of the wafer W as in the central portion. It follows that the thickness of the resist film is made more uniform. It is desirable for the rotating speed of the wafer W to be 50 to 1,000 rpm in this case. Particularly, where the rotating speed of the wafer W is not higher than 500 rpm, the drying of the resist solution scarcely proceeds, leading to a higher degree of freedom in terms of the film thickness adjustment. The holding time in this case is set appropriately not to exceed, for example, three seconds. Incidentally, it is not absolutely necessary to lower the rotating speed of the wafer W. In other words, the rotating speed of the wafer W is lowered, as required.

In the next step, the rotating speed of the wafer W is increased so as to centrifugally remove the remaining resist solution. The rotating speed of the wafer W in this step should desirably be 1,500 to 4,000 rpm in the case of the wafer having a diameter of 200 mm and 1,000 to 3,000 rpm in the case of the wafer having a diameter of 300 mm.

Then, the rotation of the wafer W is continued so as to dry the resist film. The rotating speed of the wafer W in this drying step should desirably be 1,000 to 2,000 rpm in the case of the wafer having a diameter of 200 mm and 500 to 1,500 rpm in the case of the wafer having a diameter of 300 mm. The drying operation is continued for a prescribed time, thereby finishing the resist coating process.

The resist solution supply operation performed by the resist solution supply mechanism 100 will now be described in detail.

A pressurized $N_2$ gas is blown into the bottle 101 through the $N_2$ gas pipe 110 so as to cause the resist solution L1 within the bottle 101 to flow into the buffer tank 102 through the resist solution feeding pipe 112. On the other hand, the bellows 145 is moved downward by driving the driving section 146 of the pump 103 so as to lower the pressure of the pressurizing medium L2. As a result, the resist solution L1 within the buffer tank 102 is supplied into the tubephragm 142. Then, the bellows 145 is moved upward by driving the driving section 146 so as to pressurize the pressurizing medium L2, with the result that the resist solution L1 within the tubephragm 142 is caused to flow into the resist solution feeding pipe 115. Under this condition, any of the air operation valves 121a, 121b, 121c mounted to the branched pipes 115a, 115b, 115c is opened so as to permit the resist solution to be discharged from the resist solution discharging nozzle corresponding to the resist coating process unit (COT) performing the resist coating treatment.

In replacing, for example, the bottle 101 or the filter 104, the resist solution is discharged for removing the bubbles from the resist solution from the bubble removing section 147 of the tubephragm 142 and the bubble removing section of the filter 104 prior to the actual discharging of the resist solution from the resist solution discharging nozzle. The bubble removing operation is performed as required even during the coating treatment of the resist solution. By performing the bubble removing operation, it is possible to suppress the entry of the bubbles into the resist solution discharged from the resist solution discharging nozzle. It is also possible to improve the stability of the resist solution discharging operation. The bellows pump used in the past as a pump is poor in the capability of removing the bubbles from the resist solution. However, the tubephragm pump 103 used in the present invention permits easily removing the bubbles in the case of forming the bubble removing section 147. Also, the resist solution discharged for the bubble removing operation was discarded into a drain in the past. In this embodiment of the present invention, however, the discharged resist solution is recovered in the buffer tank 102 through the recovery pipes 125 and 127 so as to decrease the consumption of the resist solution.

It should be noted that, in this embodiment of the present invention, the three resist coating process units (COT) are stacked one upon the other so as to form a three-stage structure, as described previously. Therefore, where the resist solution is supplied into these resist coating process units (COT) by using the single pump in discharging the resist solution from the resist solution discharging nozzle, the resist solution discharging nozzles used are rendered different from each other in the inner pressure of the resist solution in the vicinity of the discharging head because of the difference in the head of the pump. It follows that the discharging speed and the discharging timing of the resist solution are rendered different even if the adjustment is performed under the same recipe, with the result that the thickness profile of the resist film is rendered nonuniform depending on the resist coating process unit (COT) used.

Under the circumstances, the inner pressure of the pump 103 is controlled in this embodiment of the present invention based on the pressure values detected by the pressure sensors 131, 132a, 132b, 132c and the relationship obtained in advance between the pressure and the discharging rate of the resist solution such that the discharging rate of the resist solution is rendered equal to a prescribed value. To be more specific, where the pressure values detected by the pressure sensors 131, 132a, 132b, 132c are deviated from the values which permit achieving a desired discharging rate, the inner pressure of the pump 103 is controlled by allowing the controller 135 to control the driving section 146 of the pump 103 such that the pressure values detected by the pressure sensors noted above constitute the values corresponding to the desired discharging rate. The control system in this case is not particularly limited, and it is possible to employ various control systems. For example, it is possible to employ a PID control system or a fuzzy control system. It is also possible to employ a feed forward control system as well as the feed back control system described above. Further, it is possible to allow the control system to have a learning function based on the positive achievements.

The pressure of the resist solution was not taken into account in the past, with the result that the discharging rate and the discharging timing of the resist solution were rendered nonuniform because of, for example, the difference in the head of the pump. In this embodiment of the present invention, however, the pressure of the resist solution is detected at a prescribed position, and the inner pressure of the pump 103 is controlled so as to permit the detected pressure value to correspond to the prescribed discharging rate of the resist solution. It follows that it is possible to render the inner pressure of the resist solution substantially constant in the vicinity of the resist solution discharging nozzle regardless of the difference in the head of the pump so as to make it possible to render the discharging rate and the discharging timing of the resist solution substantially constant. Naturally, it is possible to eliminate the nonuniformity in the thickness profile of the resist film among the resist coating process units (COT).

In general, a check valve is mounted on each of the suction side and the discharge side of the pump when it comes to the pump of this kind. However, where a check valve is mounted on the discharge side of the pump, a difference is generated between the pressure inside the pump and the pressure inside the pipe on the discharge side of the pump so as to make it difficult to control accurately the inner pressure of the pump. In this embodiment of the present invention, however, a check valve is not mounted to the resist solution feeding pipe 115 on the discharge side of the pump 103 so as to form a region in which the inner region of the pump 103 is allowed to communicate with the resist solution feeding pipe 115 on the discharge side of the pump 103. It follows that a difference in pressure is not generated between the inner region of the pump 103 and the resist solution feeding pipe 115 so as to make it possible to control easily the inner pressure of the pump 103.

Incidentally, the similar control can be achieved by using the pressure sensor 131 alone mounted to the pump 103. To be more specific, the relationship between the detected pressure value of the pressure sensor 131 and the discharging rate of the resist solution is obtained in advance for each of the three resist solution discharging nozzles 90a, 90b and 90c. When the resist solution is discharged from each of these resist solution discharging nozzles, the inner pressure of the pump 103 is controlled based on the above-noted relationship obtained in advance. It should be noted, however, that the inner pressure of the pump 103 can be controlled with a higher accuracy in the case where the pressure sensors 132a, 132b and 132c are mounted in the vicinity of the resist solution discharging nozzles 90a, 90b and 90c, respectively.

It is possible to control the inner pressure of the pump 103 by a system differing from the system described above by using the pressure sensors 132a, 132b and 132c alone. For example, it is possible to control the inner pressure of the pump 103 such that the detected pressure values of the pressure sensors 132a, 132b and 132c are rendered substantially equal to each other. To be more specific, with the pressure sensor corresponding to any one of the resist solution discharging nozzles used as a reference, the inner pressure of the pump 103 is controlled such that the detected pressure values of the pressure sensors corresponding to the other resist solution discharging nozzles are rendered substantially equal to each other.

The control method described above also makes it possible to suppress effectively the nonuniformity in the discharging rate of the resist solution derived from the difference in pressure of the process liquid among a plurality of nozzles.

A resist solution supply mechanism 100' according to another embodiment of the present invention will now be described with reference to FIG. 10.

In the resist solution supply mechanism 100', a filter 104' is mounted to a resist solution feeding pipe 114' extending from the buffer tank 102, and a reservoir tank 160 for temporarily storing the resist solution flowing through the resist solution feeding pipe 114' is mounted downstream of the pump 103, as shown in the drawing. Also, the resist solution discharged from the bubble removing section of the pump 103 is sent back into the reservoir tank 160 through a recovery pipe 125'. The resist solution discharged from the bubble removing section (not shown) of a filter 104' is discarded into the drain through a pipe 127'. An air releasing pipe 161 is connected to the reservoir tank 160, and an air operation valve 162 is mounted to the air releasing pipe 161. The resist solution supply mechanism 100' shown in FIG. 10 is equal to the resist solution supply mechanism 100 shown in FIG. 1 in the other construction.

Figure 10:
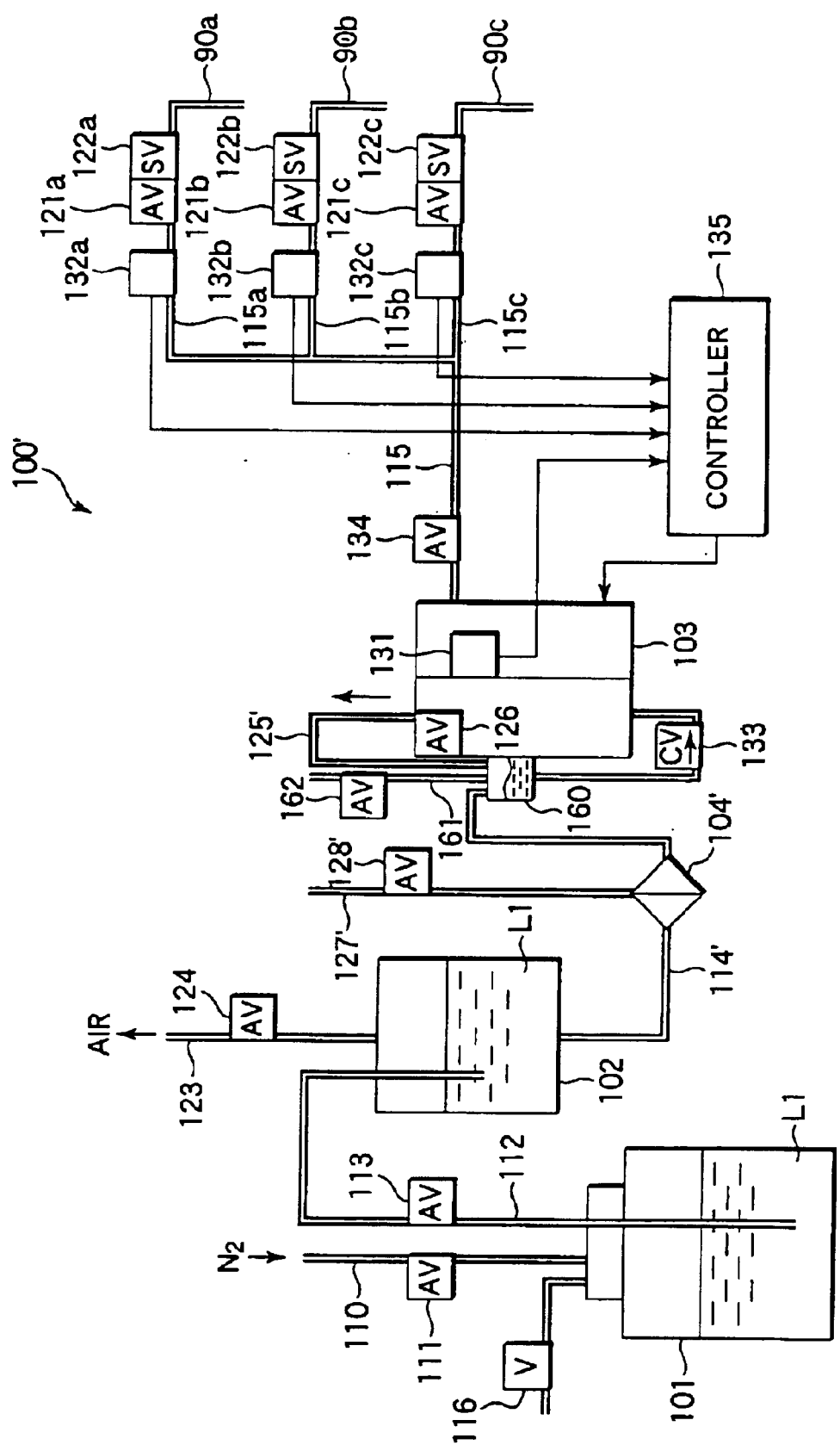
FIG. 10 is a cross sectional view showing another embodiment of the resist solution supply mechanism.

In the resist solution supply mechanism 100' shown in FIG. 10, the filter 104' in which bubbles are likely to be generated is arranged downstream of the pump 103. As a result, the possibility for bubbles to be contained in the resist solution discharged from the resist solution discharging nozzles 90a, 90b, 90c can be further decreased so as to make it possible to discharge the resist solution with a higher stability. Also, since it is possible for the bubbles contained in the resist solution when the resist solution flows through the filter 104' to be trapped in the reservoir tank 160, it is possible to minimize the effect given by the bubbles to the pump. Further, it is possible to control the inner pressure of the pump 103 as an auxiliary function by adjusting the liquid level within the reservoir tank 160.

Figure 7:
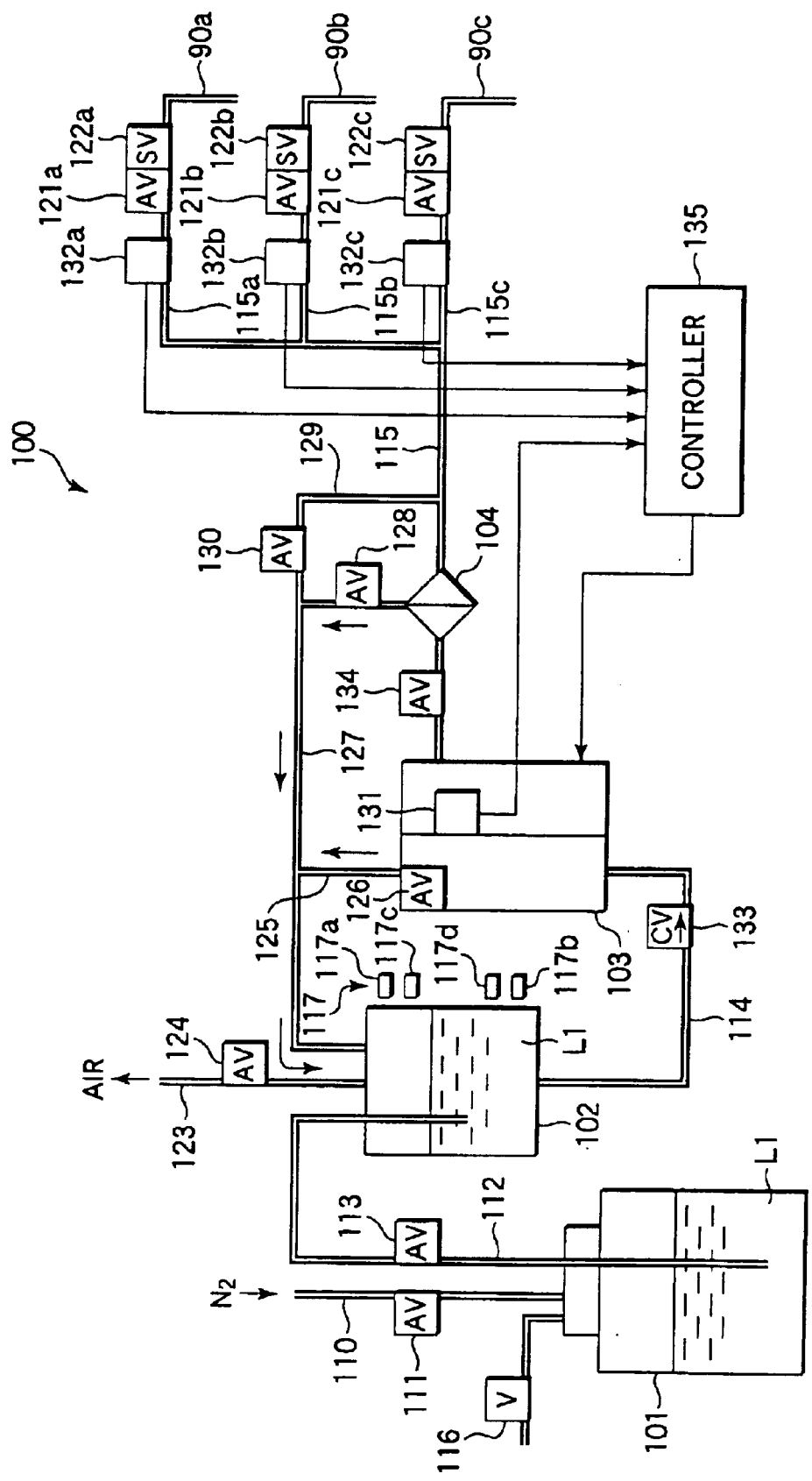
FIG. 7 schematically shows the construction of one embodiment of the resist solution supply mechanism applied to the resist coating process unit shown in FIG. 5.

The inner pressure of the pump 103 is controlled by the resist solution supply mechanism shown in each of FIGS. 7 and 10 in order to make up for the difference in head of the pump. In addition, the inner pressure of the pump 103 can be controlled for various other purposes.

Figure 11:
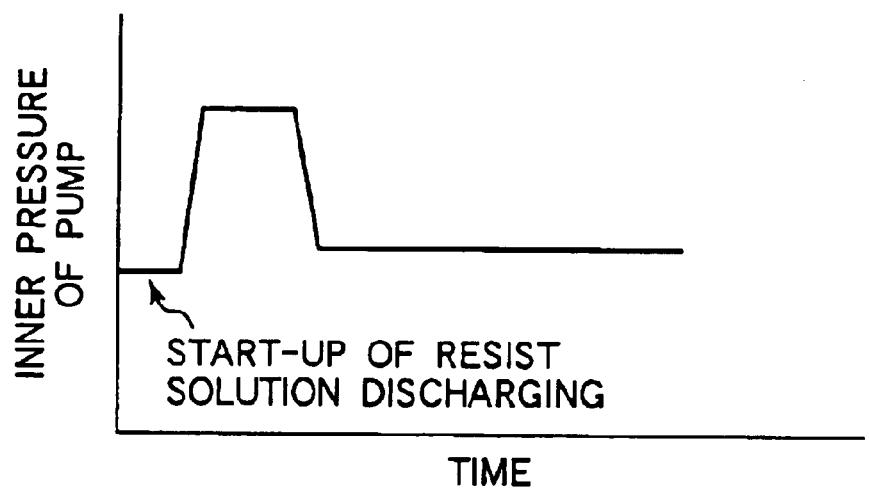
FIG. 11 is a drawing for explaining another example of the inner pressure control of the pump in discharging a resist solution from the resist solution discharging nozzle.

For example, where the resist solution is discharged onto and expanded on the wafer, the resist solution can be expanded easily if the initial discharging rate of the resist solution is high. However, if the resist solution is continued to be discharged with a high discharging rate, the resist that is wasted is increased. For overcoming the difficulty, the controller 135 controls the operation such that the inner pressure of the pump 103 is increased for a short time in the initial period of discharging the resist solution so as to increase the discharging rate of the resist solution, followed by bringing the inner pressure of the pump 103 back to the normal state, as shown in FIG. 11. The control in this case is performed based on the pressure values detected by the pressure sensors as described above. The similar effect can also be obtained by increasing the inner pressure of the pump 103 by giving a prescribed number of pulses to the pump 103 in place of the control described above.

It should also be noted that the pressure loss differs depending on the kind and material of the filter 104 so as to change the relationship between the inner pressure of the pump and the discharging rate of the resist solution and the relationship between the inner pressure of the pump and the discharging timing of the resist solution. Therefore, the information on the filter 104 is set in the controller 135 so as to permit the controller 135 to control the inner pressure of the pump 103 in a manner to eliminate the difference among the filters. In the case of using a filter having a pressure loss larger than that in the ordinary case, the similar effect can be obtained by giving a prescribed number of pulses to the pump 103 so as to increase the inner pressure of the pump 103 in place of the control described above.

Figure 12:
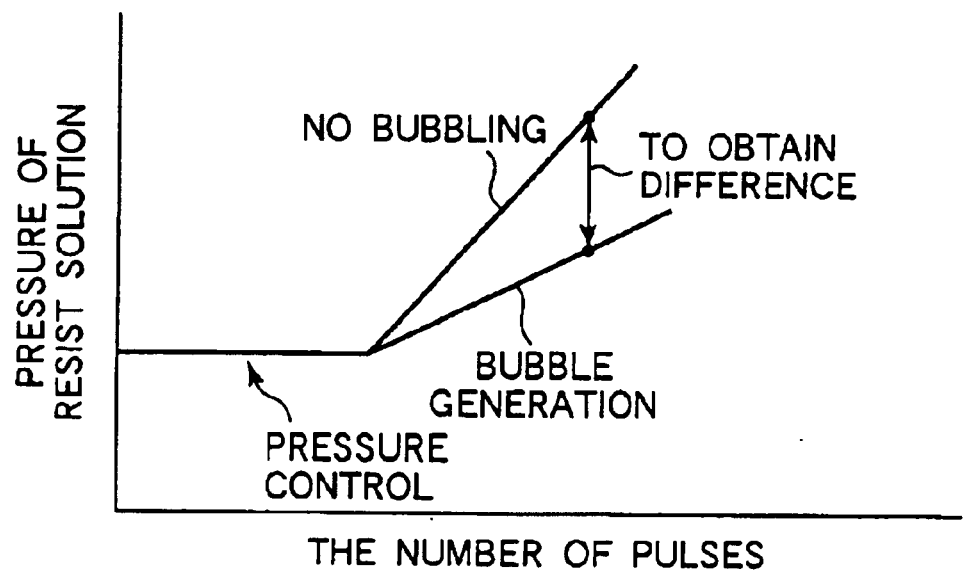
FIG. 12 is a drawing for explaining the automatic deaeration control utilizing the detected value of the resist solution pressure.

Further, if the atmospheric pressure is changed from the atmospheric pressure set in the initial stage in the case of controlling the inner pressure of the pump 103, the relationship between the pressure value detected by the pressure sensor and the inner pressure of the pump is changed. For avoiding the difficulty, it is effective to monitor the atmospheric pressure and to correct the pressure control in view of the monitored value of the atmospheric pressure.

Where bubbles are present within the pipe, it is impossible to discharge normally the resist solution. In this case, the influences given by the bubbles can be eliminated by utilizing the pressure value detected by the pressure sensor as follows. Specifically, after the pressure of the resist solution is adjusted at a prescribed value, pulses are given to the driving section 146. What should be noted is that the relationship between the number of pulses given to the driving section 146 and the actual pressure of the resist solution in the case where bubbles are present in the pipe differs from that in the case where bubbles are not present in the pipe, as shown in FIG. 12. To be more specific, in the case where bubbles are present in the pipe, the rate of the increase in the pressure of the resist solution to the increase in the number of pulses is lowered. Therefore, after the pressure of the resist solution is adjusted, the controller 135 automatically gives pulses to the driving section 146 so as to obtain the relationship between the number of pulses given to the driving section 146 and the pressures detected by the pressure sensors 132a, 132b, 13c. The relationship thus obtained is compared with the relationship between the number of pulses and the pressure of the resist solution in the normal case where bubbles are not present in the pipe, which is stored in advance in the controller 135. It is judged that there are bubbles in the case where the difference in pressure at the prescribed number of pulses is larger than a prescribed value, with the result that an instruction to remove the bubbles is transmitted to the air operation valve 126 so as to discharge the bubbles.

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

For example, in the embodiment described above, a single pump is commonly used for the three resist coating process units (COT). Alternatively, it is also possible to arrange a single pump for each of the resist coating process units (COT). In this case, it is possible to lower the fluctuation in the resist solution discharging rate derived from the difference in pressure among the pumps. Also, in the embodiment described above, the inner pressure of the pump is controlled by the controller based on the pressure value detected by the pressure sensor. Alternatively, it is also possible for the operator to control the inner pressure of the pump based on the pressure value detected by the pressure sensor. Further, it is possible to correct the control value for the inner pressure of the pump based on the relationship obtained in advance between the pressure of the process liquid and the discharging rate of the process liquid depending on the result of the periodic measurement performed by a discharging rate inspecting apparatus in respect of the discharging amount of the process liquid. Further, in the embodiment described above, a resist solution is used as the process liquid. However, it is also possible to use another process liquid as far as it is necessary to control strictly the discharging rate of the process liquid. Still further, a tubephragm pump is used as the pump in the embodiment described above. However, it is also possible to use another pump including a pressurizing body that can be moved by the pressure of a pressurizing medium such that the pressure of the pressurizing body is exerted on the process liquid so as to permit the process liquid to be discharged from the process liquid discharging nozzle. For example, a diaphragm pump can be used suitably.

What is claimed is:

1. A process liquid supply mechanism for supplying a process liquid, comprising:
   a process liquid supply source for supplying a process liquid;
   a process liquid discharging nozzle for discharging the process liquid;
   a pipe connecting the process liquid supply source to the process liquid discharging nozzle;
   a pump mounted to the pipe for allowing the process liquid to be discharged from the process liquid discharging nozzle;
   a pressure sensor for detecting a pressure of the process liquid at a prescribed position intermediate between the pump and the process liquid discharging nozzle, wherein the pressure sensor is mounted in a vicinity of the nozzle; and
   a controller for controlling the inner pressure of the pump based on the pressure value detected by the pressure sensor and a relationship obtained in advance between the pressure and the discharging rate of the process liquid such that the process liquid is discharged at a prescribed discharging rate.

2. The process liquid supply mechanism according to claim 1, wherein the pressure sensor is mounted to the pump.

3. The process liquid supply mechanism according to claim 1, further comprising a plurality of process liquid discharging nozzles.

4. The process liquid supply mechanism according to claim 1, further comprising a valve for selectively allowing the process liquid discharging nozzle to discharge the process liquid and to cease to discharge the process liquid.

5. The process liquid supply mechanism according to claim 1, wherein the pump includes a pressurizing body that is moved by a pressure of a pressurizing medium such that the pressure of the pressurizing medium is exerted on the process liquid so as to permit the process liquid to be discharged from the process liquid discharging nozzle.

6. The process liquid supply mechanism according to claim 5, wherein the pump is a tubephragm pump.

7. The process liquid supply mechanism according to claim 1, further comprising a buffer tank mounted to the pipe for temporarily storing the process liquid.

8. The process liquid supply mechanism according to claim 7, further comprising a bubble removing section mounted to the pump and a recovery pipe for recovering the process liquid discharged from the bubble removing section of the pump in the buffer tank.

9. The process liquid supply mechanism according to claim 1, further comprising a filter mounted to the pipe.

10. The process liquid supply mechanism according to claim 9, wherein the controller controls the inner pressure of the pump based on the data on the pressure loss of the filter.

11. The process liquid supply mechanism according to claim 1, further comprising a filter mounted to the pipe on the upstream side of the pump and a reservoir tank mounted in the inlet portion of the process liquid of the pump.

12. The process liquid supply mechanism according to claim 11, further comprising a bubble removing section mounted to the filter and a recovery pipe for recovering the process liquid discharged from the bubble removing section of the filter in the reservoir tank.

13. The process liquid supply mechanism according to claim 1, wherein the process liquid is a resist solution.

14. The process liquid supply mechanism according to claim 13, wherein the controller controls the inner pressure of the pump such that the discharging rate of the resist solution is increased in an initial stage of the discharging.

15. The process liquid supply mechanism according to claim 1, wherein the controller automatically gives pulses to the pump thereby obtaining a relationship between a number of pulses and the pressure detected by the pressure sensor, compares the relationship thus obtained with a relationship stored in advance between a number of pulses and a pressure in the normal case where bubbles are not contained in the process liquid, and generates an instruction to perform a bubble removing operation in a case where it is judged that bubbles are contained in the process liquid.

16. A process liquid supply mechanism for supplying a process liquid, comprising:
   a process liquid supply source for supplying the process liquid;
   a plurality of process liquid discharging nozzles, which are selectively allowed to discharge the process liquid;
   piping including a main pipe extending from the process liquid supply source and a plurality of subsidiary pipes branched from the main pipe so as to reach the plurality of process liquid discharging nozzles;
   a pump mounted to the main pipe for allowing the process liquid to be discharged from the process liquid discharging nozzles;
   a plurality of pressure sensors for detecting respectively pressures of the process liquid in the vicinity of the plurality of process liquid discharging nozzles; and
   a controller for controlling the inner pressure of the pump in allowing the process liquid to be discharged from each of the process liquid discharging nozzles such that the respective pressure values detected by the plurality of pressure sensors mounted in the vicinity of the plurality of process liquid discharging nozzles are rendered substantially equal to each other.

17. The process liquid supply mechanism according to claim 16, further comprising a valve for selectively allowing each process liquid discharging nozzle to discharge the process liquid and to cease to discharge the process liquid.

18. The process liquid supply mechanism according to claim 16, wherein the pump includes a pressurizing body that is moved by a pressure of a pressurizing medium such that the pressure of the pressurizing medium is exerted on the process liquid so as to permit the process liquid to be discharged from each process liquid discharging nozzle.

19. The process liquid supply mechanism according to claim 18, wherein the pump is a tubephragm pump.

20. The process liquid supply mechanism according to claim 16, further comprising a buffer tank mounted to the pipe for temporarily storing the process liquid.

21. The process liquid supply mechanism according to claim 20, further comprising a bubble removing section mounted to the pump and a recovery pipe for recovering the process liquid discharged from the bubble removing section of the pump in the buffer tank.

22. The process liquid supply mechanism according to claim 16, further comprising a filter mounted to the pipe.

23. The process liquid supply mechanism according to claim 22, wherein the controller controls the inner pressure of the pump based on the data on the pressure loss of the filter.

24. The process liquid supply mechanism according to claim 16, further comprising a filter mounted to the pipe on the upstream side of the pump and a reservoir tank mounted in the inlet portion of the process liquid of the pump.

25. The process liquid supply mechanism according to claim 24, further comprising a bubble removing section mounted to the filter and a recovery pipe for recovering the process liquid discharged from the bubble removing section of the filter in the reservoir tank.

26. The process liquid supply mechanism according to claim 16, wherein the process liquid is a resist solution.

27. The process liquid supply mechanism according to claim 26, wherein the controller controls the inner pressure of the pump such that the discharging rate of the resist solution is increased in an initial stage of the discharging.

28. The process liquid supply mechanism according to claim 16, wherein the controller automatically gives pulses to the pump thereby obtaining a relationship between the number of pulses and the pressure detected by the pressure sensor, compares the relationship thus obtained with a relationship stored in advance between the number of pulses and a pressure in a normal case where bubbles are not contained in the process liquid, and generates an instruction to perform a bubble removing operation in a case where it is judged that bubbles are contained in the process liquid.

29. A process liquid supply method, in which a pump is driven so as to permit a process liquid in a process liquid supply source to be supplied into a process liquid discharging nozzle through a pipe for allowing the process liquid to be discharged from the process liquid discharging nozzle, the method comprising the steps of:

driving the pump so as to supply the process liquid from the process liquid supply source into the pipe;

detecting the pressure of the process liquid in the vicinity of the process liquid discharging nozzle; and controlling the inner pressure of the pump based on the detected value of the pressure of the process liquid and the relationship obtained in advance between the pressure and the discharging rate of the process liquid such that the process liquid is discharged from the process liquid discharging nozzle at a prescribed discharging rate.

30. A process liquid supply method, in which a pump is driven so as to permit a process liquid in a process liquid supply source to be supplied through piping into a plurality of process liquid discharging nozzles for selectively allowing the plurality of process liquid discharging nozzles to discharge the process liquid, comprising the steps of:

driving the pump for supplying the process liquid from the process liquid supply source into the piping; and detecting respective pressures of the process liquid in a vicinity of the plurality of process liquid discharging nozzles, and controlling the inner pressure of the pump such that the detected pressure values of the process liquid are rendered substantially equal to each other.

* * * * *